(12) United States Patent
Hirai

(10) Patent No.: US 6,664,911 B2
(45) Date of Patent: Dec. 16, 2003

(54) DIFFERENTIAL INPUT A/D CONVERTER

(75) Inventor: Kouji Hirai, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/283,324

(22) Filed: Oct. 30, 2002

(65) Prior Publication Data

US 2003/0098808 A1 May 29, 2003

(30) Foreign Application Priority Data

Nov. 12, 2001 (JP) ........................................ 2001-345792

(51) Int. Cl.[7] ................................................. H03M 1/36
(52) U.S. Cl. ........................ 341/159; 341/163; 341/161
(58) Field of Search ................................. 341/161, 155, 341/144, 159, 163

(56) References Cited

U.S. PATENT DOCUMENTS

| | | | | |
|---|---|---|---|---|
| 5,072,220 A | * | 12/1991 | Petschacher et al. | 341/156 |
| 5,764,175 A | * | 6/1998 | Pan | 341/161 |
| 6,411,241 B1 | * | 6/2002 | Taketoshi | 341/155 |
| 6,424,284 B1 | * | 7/2002 | Lopata et al. | 341/163 |
| 2002/0154049 A1 | * | 10/2002 | Hsueh | 341/161 |

* cited by examiner

*Primary Examiner*—Peguy JeanPierre
(74) *Attorney, Agent, or Firm*—McGinn & Gibb, PLLC (57) ABSTRACT

A differential input A/D converter includes a first A/D converter, second A/D converter, and digital subtracter. The first A/D converter outputs the first conversion result obtained by A/D-converting the first analog input signal. The second A/D converter outputs the second conversion result obtained by A/D-converting the second analog input signal. The digital subtracter outputs the differential conversion result obtained by subtracting the second conversion result output from the second A/D converter from the first conversion result output from the first A/D converter. The first A/D converter A/D-converts the difference between the analog value obtained from an output of the second A/D converter and the second analog input signal output from the second A/D converter and superimposes the A/D conversion result on the first conversion result.

14 Claims, 6 Drawing Sheets

DIFFERENTIAL INPUT A/D CONVERTER

BACKGROUND OF THE INVENTION

The present invention relates to a differential input A/D converter which converts the potential difference between two analog input signals from an analog value to a digital value.

In a differential input A/D converter which converts the potential difference between two analog input signals from an analog value to a digital value, the potential difference between two analog input voltages needs to be converted into a digital value at the same time. In addition, in order to perform fine control by using a control device such as microcontroller on the basis of a converted digital value, conversion with higher accuracy is required.

Figure 6:
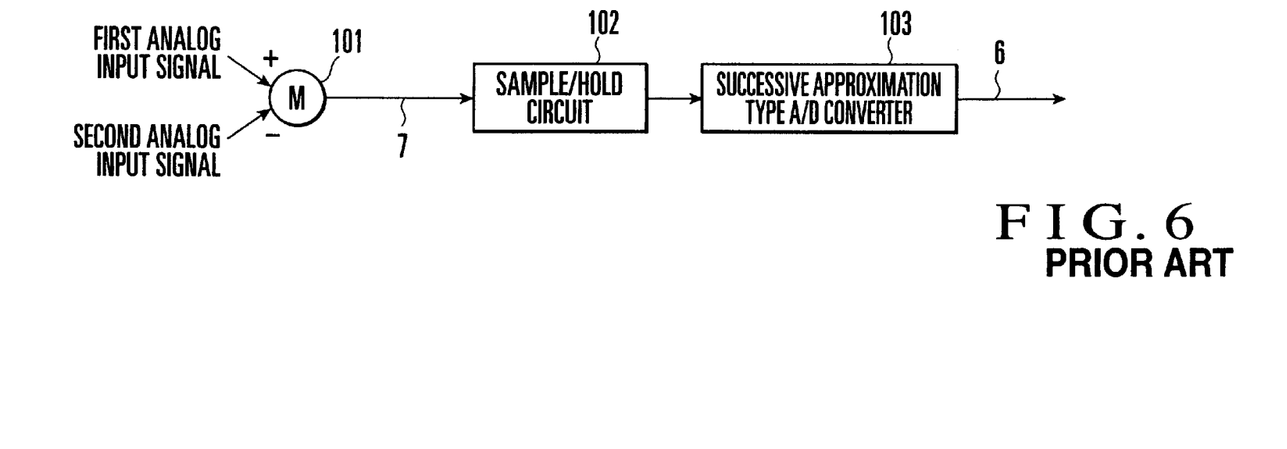
FIG. 6 is a block diagram showing a conventional differential input A/D converter.
Figure 7:
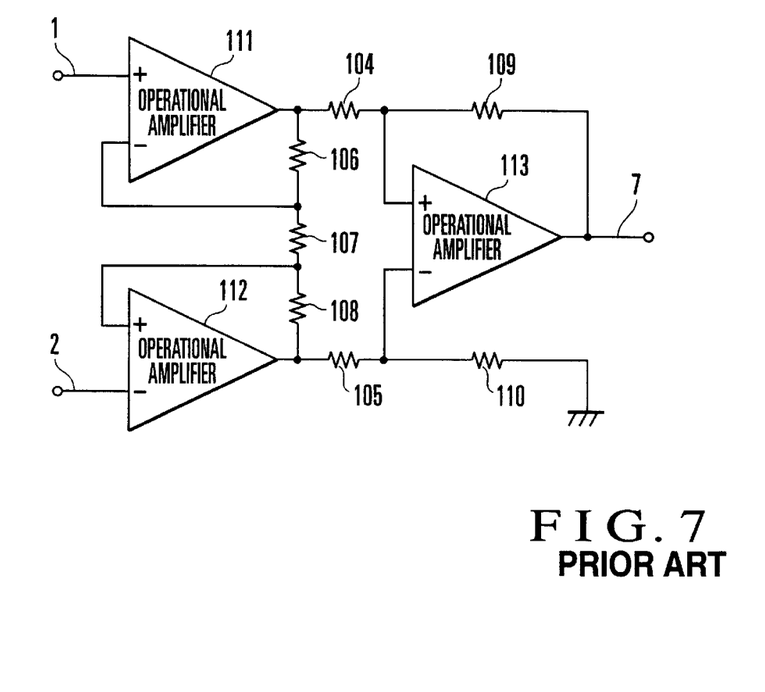
FIG. 7 is a block diagram showing the analog subtracter shown in FIG. 6.

The conventional differential input A/D converter shown in FIG. 6 converts first and second analog input signals 1 and 2 into a single-end signal 7 by using an analog subtracter 101. After the single-end signal 7 is sampled by a sample/hold circuit 102, the sampled value is converted into a digital value by a successive approximation type A/D converter 103. This signal is then output as a conversion result 6. As shown in FIG. 7, the analog subtracter 101 is comprised of three operational amplifiers 111 to 113 and resistors 104 to 110.

Figure 8:
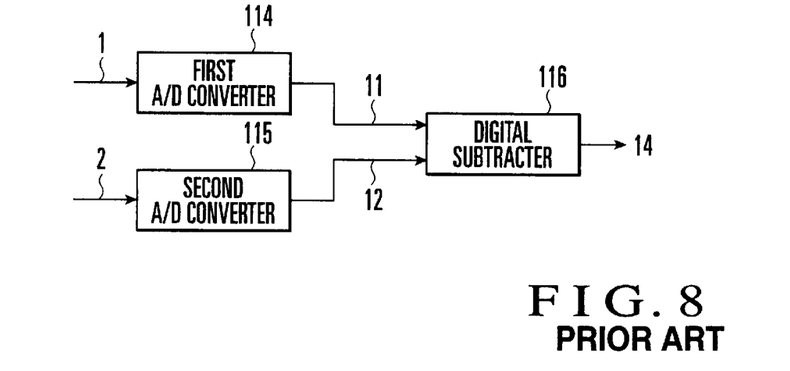
FIG. 8 is a block diagram showing another conventional differential input A/D converter.

FIG. 8 shows another conventional differential input A/D converter. Referring to FIG. 8, the conventional differential input A/D converter converts a first analog input signal 1 into a digital value by using a first A/D converter 114 and outputs it as a first conversion result 11. At the same time, the differential input A/D converter converts a second analog input signal 2 into a digital value by using a second A/D converter 115 and outputs it as a second conversion result 12. The differential input A/D converter then calculates the difference between the first and second conversion results 11 and 12 by using a digital subtracter 116, and outputs the difference as a differential conversion result 14.

In the differential input A/D converter shown in FIG. 6, the three operational amplifiers 111 to 113 constituting the analog subtracter 101 have errors such as offsets. These errors are superimposed to become a conversion error, and hence the error in the differential input A/D converter increases. In addition, in order to prevent an increase in error due to the operational amplifiers 111 to 113, the differential input A/D converter must incorporate high-precision operational amplifiers 111 to 113. This however causes an increase in chip area.

In addition, only when the first analog input signal 1 higher in voltage than the second analog input signal 2, the potential difference can be A/D-converted. If, however, the first analog input signal 1 is lower in voltage than the second analog input signal 2, the conversion result becomes zero.

Letting ADCR1 be the value of the first conversion result 11 in the differential input A/D converter shown in FIG. 8, and ADCR2 be the value of the second conversion result 12, a value ADCR of the differential conversion result 14 can be given by $$ADCR = ADCR1 - ADCR2 \tag{1}$$

In addition, letting Vin1 be the voltage of the first analog input signal 1, Vin2 be the voltage of the second analog input signal 2, Verr1 be the conversion error in the A/D converter 114, Verr2 be the conversion error in the A/D converter 115, V(ADCR1) be the function for which the first conversion result 11 is converted into an analog voltage, and V(ADCR2) be the function for which the second conversion result 12 is converted into an analog voltage, the voltages Vin1 and Vin2 are given by $$Vin1 = V(ADCR1) + Verr1 \tag{2}$$

$$Vin2 = V(ADCR2) + Verr2 \tag{3}$$

Letting V(ADCR) be the function for which the differential conversion result 14 is converted into an analog voltage, the differential conversion result 14 obtained by the differential input A/D converter can be generally given by $$Vin1 - Vin2 = V(ADCR) + Verr \tag{4}$$

Substitutions of equations (2) and (3) into equation (4) yield equation (5):

$$V(ADCR) + Verr = \{V(ADCR1) + Verr1\} - \{V(ADCR2) + Verr2\} \tag{5}$$
$$= V(ADCR1) - V(ADCR2) + Verr1 - Verr2$$

The conversion error in the differential conversion result 14 therefore becomes (Verr1−Verr2). Since the conversion errors Verr1 and Verr2 are independent of each other, the error in the differential conversion result 14 is equal to the value obtained by superimposing the errors in the two A/D converters 114 and 115. Therefore, in the differential input A/D converter shown in FIG. 8, if the errors in the two A/D converters 114 and 115 are similar, the conversion error becomes almost double, at maximum, that when one A/D converter is used.

With regard to quantization errors which A/D converters theoretically have, in particular, a quantization error of −½ to +½ LSB in the A/D converter 114 and a quantization error of −½ to +½ LSB in the A/D converter 115 are added together. As a consequence, the differential input A/D converter has a quantization error of −1.0 to +1.0 LSB. In other words, if the resolution of the two A/D converters 114 and 115 is n bits, the resolution of the differential input A/D converter constituted by the A/D converter 114 and 115 becomes substantially (n−1) bits, which is smaller than n bits by one bit.

SUMMARY OF THE INVENTION

It is an object of the present invention to provide a high-precision differential input A/D converter without increasing the precision of A/D converters and analog subtracters.

In order to achieve the above object, according to the present invention, there is provided a differential input A/D converter which converts a potential difference between two analog input signals from an analog value to a digital value, comprising first A/D conversion means for outputting a first conversion result obtained by A/D-converting a first analog input signal, second A/D conversion means for outputting a second conversion result obtained by A/D-converting a second analog input signal, and digital subtraction means for outputting a differential conversion result obtained by subtracting the second conversion result output from the second A/D conversion means from the first conversion result output from the first A/D conversion means, wherein the first A/D conversion means A/D-converts a difference between an analog value obtained from an output of the second A/D conversion means and the second analog input signal output from the second A/D conversion means and superimposes the A/D conversion result on the first conversion result.

DESCRIPTION OF THE PREFERRED EMBODIMENTS

The present invention will be described in detail below with reference to the accompanying drawings.

Figure 1:
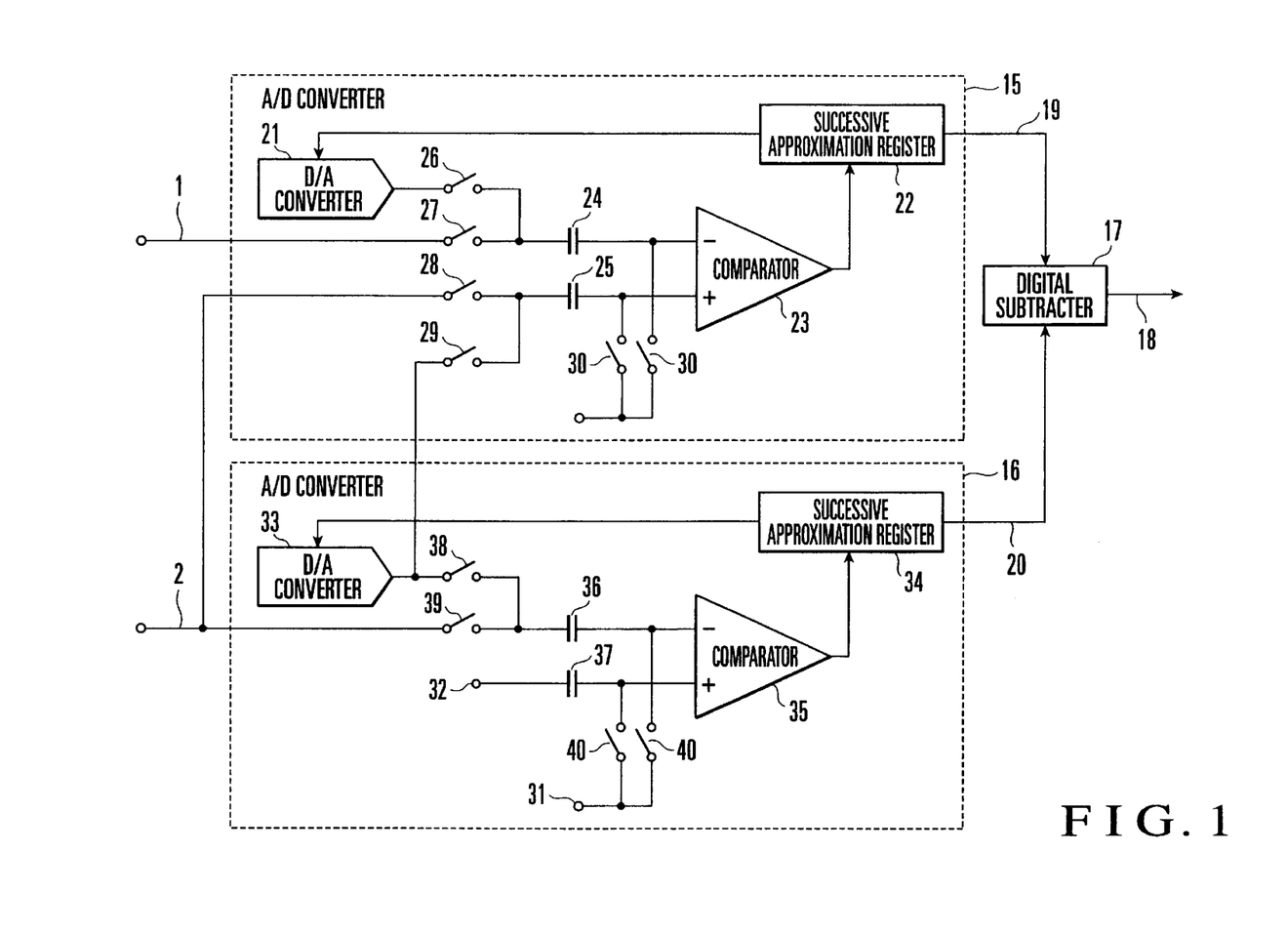
FIG. 1 is a block diagram of a successive approximation type differential input A/D converter according to the first embodiment of the present invention.

FIG. 1 shows a successive approximation type differential input A/D converter according to the first embodiment of the present invention. As shown in FIG. 1, the successive approximation type differential input A/D converter according to this embodiment is comprised of an A/D converter 15, A/D converter 16, and digital subtracter 17.

The A/D converter 15 receives a first analog input signal 1, second analog input signal 2, and the D/A conversion signal output from the A/D converter 16, and outputs a first conversion result 19. The A/D converter 16 receives the second analog input signal 2 and outputs a second conversion result 20. The A/D converter 16 outputs a D/A conversion signal to the A/D converter 15. The digital subtracter 17 receives the first conversion result 19 from the A/D converter 15 and the second conversion result 20 from the A/D converter 16, and outputs a differential conversion result 18 as the result obtained by the subtraction result of the input results.

The A/D converter 15 includes a D/A converter 21, successive approximation register 22, comparator 23, a switches 26 to 30, and sample/hold capacitors 24 and 25. As will be described later, the D/A converter 21 outputs a D/A conversion signal to the comparator 23, and the comparator 23 outputs a signal representing a comparison result to the successive approximation register 22. The successive approximation register 22 outputs the first conversion result 19 to the digital subtracter 17 and also outputs a digital value to the D/A converter 21.

The second analog input signal 2 supplied via the switch 28 and sample/hold capacitor 25 and a D/A conversion output supplied from a D/A converter 33 via the switch 29 and sample/hold capacitor 25 are selectively input to the non-inverting input terminal of the comparator 23. The first analog input signal 1 supplied via the switch 27 and sample/hold capacitor 24 and a D/A conversion output supplied from the D/A converter 21 via the switch 26 and sample/hold capacitor 24 are selectively input to the inverting input terminal of the comparator 23. A first reference voltage 31 is selectively applied to the inverting and non-inverting input terminal of the first comparator 23 via the pair of switches 30.

The A/D converter 16 includes the D/A converter 33, a successive approximation register 34, a comparator 35, and switches 38 to 40, and sample/hold capacitors 36 and 37. As will be described later, the D/A converter 33 outputs a D/A conversion signal to the comparator 35, and the comparator 35 outputs a signal representing a comparison result to the successive approximation register 34. The successive approximation register 34 outputs the second conversion result 20 to the digital subtracter 17, and also outputs a digital value to the D/A converter 33.

The second analog input signal 2 supplied via the switch 39 and sample/hold capacitor 36 and the output signal supplied from the D/A converter 33 via the switch 38 and the sample/hold capacitor 36 are selectively input to the inverting input terminal of the comparator 35. The second reference voltage 32 is applied to the non-inverting input terminal of the comparator 35 via the sample/hold capacitor 37. The first reference voltage 31 is selectively applied to the inverting and non-inverting terminals of the comparator 35 via the pair of switches 40.

The operation of the differential input A/D converter having the above arrangement will be described next with reference to FIGS. 2A to 2H. In A/D conversion according to this embodiment, four operations, i.e., first successive approximation, second successive approximation, and subtraction, are sequentially executed. Before A/D conversion, all the switches 26 to 30 and 38 to 40 are OFF.

At the start of A/D conversion, the switches 27, 28, and 30 and switches 30 and 40 are turned on (FIGS. 2A and 2B), and sampling is started. That is, the sample/hold capacitor 24 samples the differential voltage the first analog input signal 1 and the first reference voltage 31. The sample/hold capacitors 25 and 36 sample the differential voltage between the second analog input signal 2 and the first reference voltage 31. The sample/hold capacitor 37 samples the differential voltage between the second reference voltage 32 and the first reference voltage 31.

When the switches 30 and 40 are turned off, the differential voltages sampled by the /hold capacitors 24, 25, 36, and 37 are held by the sample/hold capacitors 24, 25, 36, and 37 until the A/D conversion is completed. When the switches 27, 28, and 39 are turned off, the inputting of the first analog input signal 1 and second analog input signal 2 is stopped.

When the switches 26 and 38 are turned on (FIGS. 2C and 2D), an output signal from the D/A converter 21 is connected to the sample/hold capacitor 24, and an output signal from the D/A converter 33 is connected to the sample/hold capacitor 36. With this operation, the A/D converter 16 starts the first successive approximation.

In the first successive approximation, a target bit in the successive approximation register 34 is set to "1", and the digital value of the successive approximation register 34 at this time is D/A-converted by the D/A converter 33. The analog signal obtained by D/A conversion is output to the inverting input terminal of the second comparator 35 via the switch 38 and sample/hold capacitor 36. As a result, the differential voltage between an output signal from the D/A converter 33 and the voltage held by the sample/hold capacitor 36 is input to the inverting input terminal of the comparator 35. The comparator 35 compares the voltage at the inverting input terminal and the voltage at the non-inverting input terminal, and stores the comparison result at the target bit in the successive approximation register 34.

When comparison operation is performed using the most significant bit in the successive approximation register 34 as a target bit is performed to store the comparison result at the most significant bit, comparison operation is performed using the second most significant bit in the successive approximation register 34 as a target bit to store the comparison result at the second bit in the second successive approximation register 34. Subsequently, comparison operation is performed using the third most significant bit in the second successive approximation register 34 as a target bit. In this manner, successive approximation operation is sequentially performed while the target bit is shifted from the most significant bit to lower significant bits bit by bit.

Figure 2A:
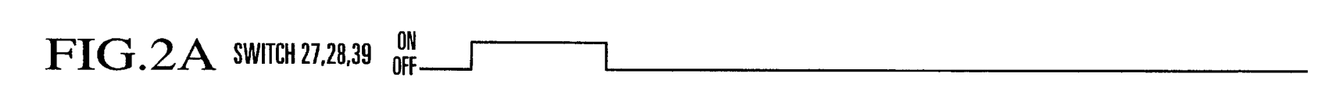
FIGS. 2A to 2H are timing charts of the differential input A/D converter shown in FIG. 1.
Figure 2B:
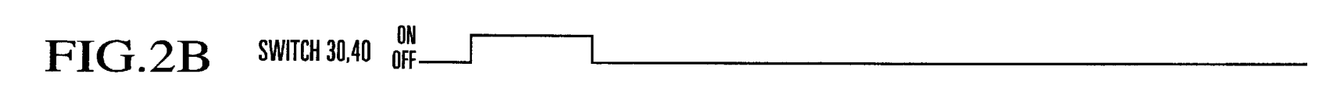
Figure 2C:
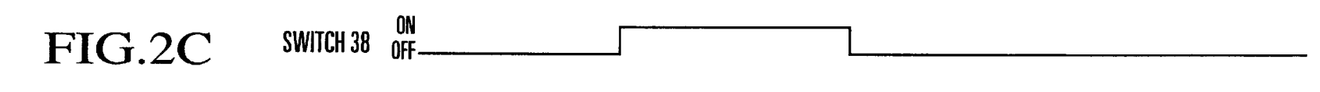
Figures 2D, 2E:
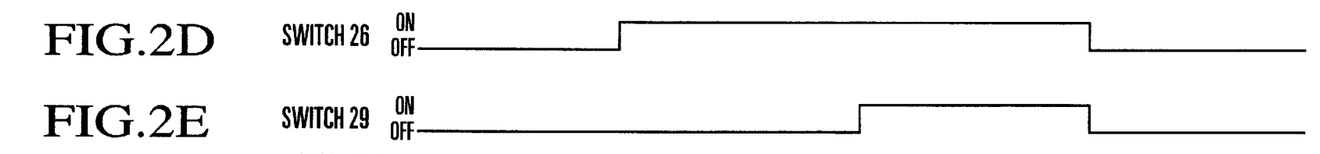
Figure 2F:
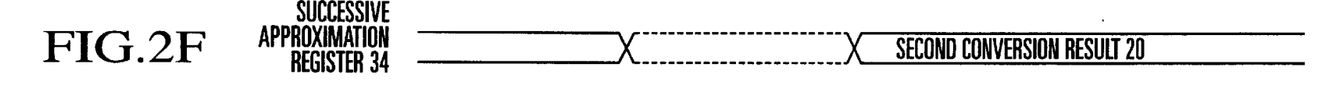

When the comparison operation using the least significant bit in the successive approximation register 34 as a target bit is completed and the comparison results are stored at all the bits in the successive approximation register 34, the first successive approximation is completed. Upon completion of the first successive approximation, the digital value stored in the successive approximation register 34 is output as the second conversion result 20 (FIG. 2F). In the above manner, the A/D converter 16 outputs the digital value obtained by A/D-converting the second analog input signal 2, i.e., the second conversion result 20, to the digital subtracter 17. After the first comparison is completed, the switch 38 is turned off.

When the switch 29 is turned on next (FIG. 2E), an output signal from the D/A converter 33 is connected to the sample/hold capacitor 25 to start the second successive approximation. In the second successive approximation, a target bit in the successive approximation register 22 is set to "1", and the digital value of the successive approximation register 22 at this time is D/A-converted by the D/A converter 21. The analog signal obtained by the D/A conversion is output to the inverting input terminal of the comparator 23 via the sample/hold capacitor 24.

As a result, the differential voltage between the output signal from the D/A converter 21 and the voltage held by the sample/hold capacitor 24 is input to the inverting input terminal of the comparator 23. The differential voltage between the output signal from the D/A converter 33 and the voltage held by the sample/hold capacitor 25 is input to the non-inverting input terminal of the comparator 23. The comparator 23 compares the voltage at the inverting input terminal with the voltage at the non-inverting input terminal, and stores the comparison result at the target bit in the successive approximation register 22.

When the comparison result is stored at the most significant bit by the comparison operation using the most significant bit in the successive approximation register 22 as a target bit, the comparison result obtained by comparison operation using the second most significant bit in the successive approximation register 22 as a target bit is stored at the second bit in the successive approximation register 22. Subsequently, comparison operation is performed by using the third most significant bit in the successive approximation register 22 as a target bit. In this manner, successive approximation operation is sequentially performed while the target bit is shifted from the most significant bit to lower significant bits bit by bit.

Figure 2G:
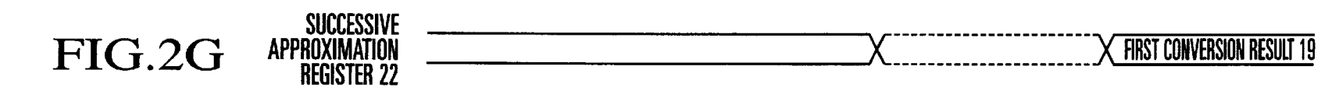

When the successive approximation using the least significant bit in the first successive approximation register 22 as a target bit is completed and the comparison results are stored at all the bits in the first successive approximation register 22, the second successive approximation is completed. Upon completion of the second successive approximation, the digital value stored in the successive approximation register 22 is output as the first conversion result 19 (FIG. 2G). In the above manner, the A/D converter 15 outputs the digital value obtained by A/D-converting the first analog input signal 1, i.e., the first conversion result 19, to the digital subtracter 17.

Figure 2H:
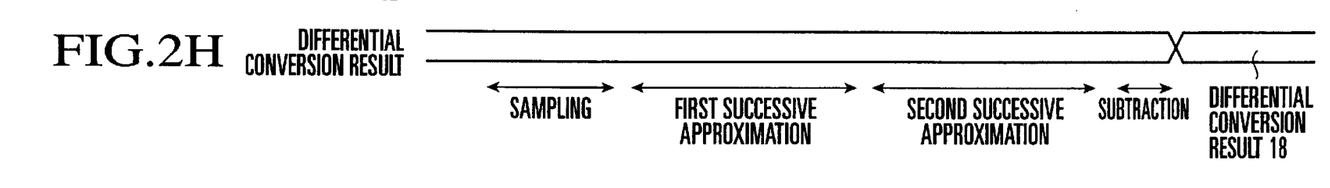

After the second successive approximation is completed, the switches 26 and 29 are turned off. The digital subtracter 17 subtracts the second conversion result 20 from the first conversion result 19, and outputs the differential conversion result 18 as the subtraction result (FIG. 2H).

When the second analog input signal 2 is A/D-converted by the A/D converter 16, letting Vin_M be the voltage of the second analog input signal 2, Verr_M be the quantization error in the A/D converter 16, and V (ADCR_M) be the function for converting the second conversion result 20 into an analog voltage, the voltage Vin_M can be represented by $$Vin\_M = V(ADCR\_M) + Verr\_M \qquad (6)$$

In the A/D converter 15, when the switch 29 is turned on at the time of the second successive approximation, input switching is done from the second analog input signal 2 to the output signal from the D/A converter 33. With this operation, V(ADCR_M) is applied via the sample/hold capacitor 25, and the input voltage changes from Vin_M at the time of sampling to V(ADCR_M) at the time of second successive approximation, as indicated by $$Vin\_M \rightarrow V(ADCR\_M) \qquad (7)$$

The first analog input signal 1 is input to the inverting input terminal of the comparator 23 via the sample/hold capacitor 24. Immediately after sampling, both the input voltages to the comparator 23 are equal to the first reference voltage 31. At the time of the start of the second successive approximation, the voltage to be applied to the sample/hold capacitor 25 changes on the non-inverting input terminal side of the comparator 23, as indicated by mathematical expression (7). Therefore, equation (8) holds using charge conservation according to equation (6):

$$Vref1 - \{Vin\_M - V(ADCR\_M)\} = Vref1 - Verr\_M \qquad (8)$$

In equation (8), Vref1 is the value of the first reference voltage 31. Therefore, the voltage to be searched out by the second successive approximation is the voltage (Verf1−Verr_M) at the inverting input terminal of the comparator 23. This voltage is expressed as (Vin_P−Verr_M) in terms of the voltage at the input side of the sample/hold capacitor 24 according to charge conservation.

Letting ADCR_P be the value of the first conversion result 19 as the result obtained by A/D-converting this voltage, V(ADCR_P) be the function for converting the value of the first conversion result 19 into an analog voltage, Vin_P be the voltage of the first analog input signal 1, and Verr be the quantization error in the A/D converter 15, equation (9) holds:

$$Vin\_P - Verr\_M = V(ADCR\_P) + Verr \qquad (9)$$

Equation (9) indicates that the quantization error Verr_M in the A/D converter 16 is superimposed on the first analog input signal 1, and the resultant signal is _A/D-converted by the A/D converter 15. Letting V(ADCR) be the function for converting the differential conversion result 18 into an analog voltage, the differential conversion result 18 is given by $$V(ADCR) = V(ADCR\_P) - V(ADCR\_M) \qquad (10)$$

Substitutions of modifications to equations (6) and (9) into equation (10) yield equation (11):

$$V(ADCR) = (Vin\_P - Verr\_M - Verr) - (Vin\_M - Verr\_M) \quad (11)$$
$$= Vin\_P - Vin\_M - Verr$$

In this embodiment, the quantization error Verr__M in the A/D converter 16 is A/D-converted by the A/D converter 15, while being superimposed on the first analog input signal 1, by inputting the output signal from the D/A converter 21 and the first analog input signal 1 to the inverting input terminal of the comparator 23 via the sample/hold capacitor 24 and inputting the output signal from the D/A converter 33 and the second analog input signal 2 to the non-inverting input terminal of the comparator 23 via the sample/hold capacitor 25.

The quantization error Verr__M produced in the first successive approximation is canceled out as indicated by equation (11) by subtracting the second conversion result 20 containing the quantization error Verr__M in the A/D converter 16 from the first conversion result 19 containing the quantization error Verr__M in the A/D converter 16. As a result, the only quantization error that appears in the differential conversion result 18 is the quantization error Verr produced in the second successive approximation by the A/D converter 15, and hence falls within the range of −½ LSB to +½ LSB.

Although only the quantization error has been discussed, if Verr__M is considered as the overall error in the A/D converter 16, the overall error in the A/D converter 16 is canceled out, and only the error in the A/D converter 15 is reflected in the differential conversion result 18.

This embodiment has been described on the assumption that the resolution of the A/D converter 15 is equal to that of the A/D converter 16. If, however, the comparator 23 has a sufficiently wide in-phase input range, sufficient conversion precision can be obtained even if the resolution of the A/D converter 16 is not equal to that of the A/D converter 15 as long as they have the same voltage precision. In addition, even if the A/D converter 15 and A/D converter 16 are A/D converters having the same n-bit resolution and conversion of less than n bits from an upper bit is done in the first successive approximation, the same effect as that described above can be obtained.

In this embodiment, since the differential conversion result 18 which is a digital value is obtained, differential input A/D conversion can be executed regardless of the relationship of magnitude between the first analog input signal 1 and the second analog input signal 2. Furthermore, if one sign bit is added to the differential conversion result 18, the relationship of magnitude between the first analog input signal 1 and the second analog input signal 2 can also be expressed.

Figure 3:
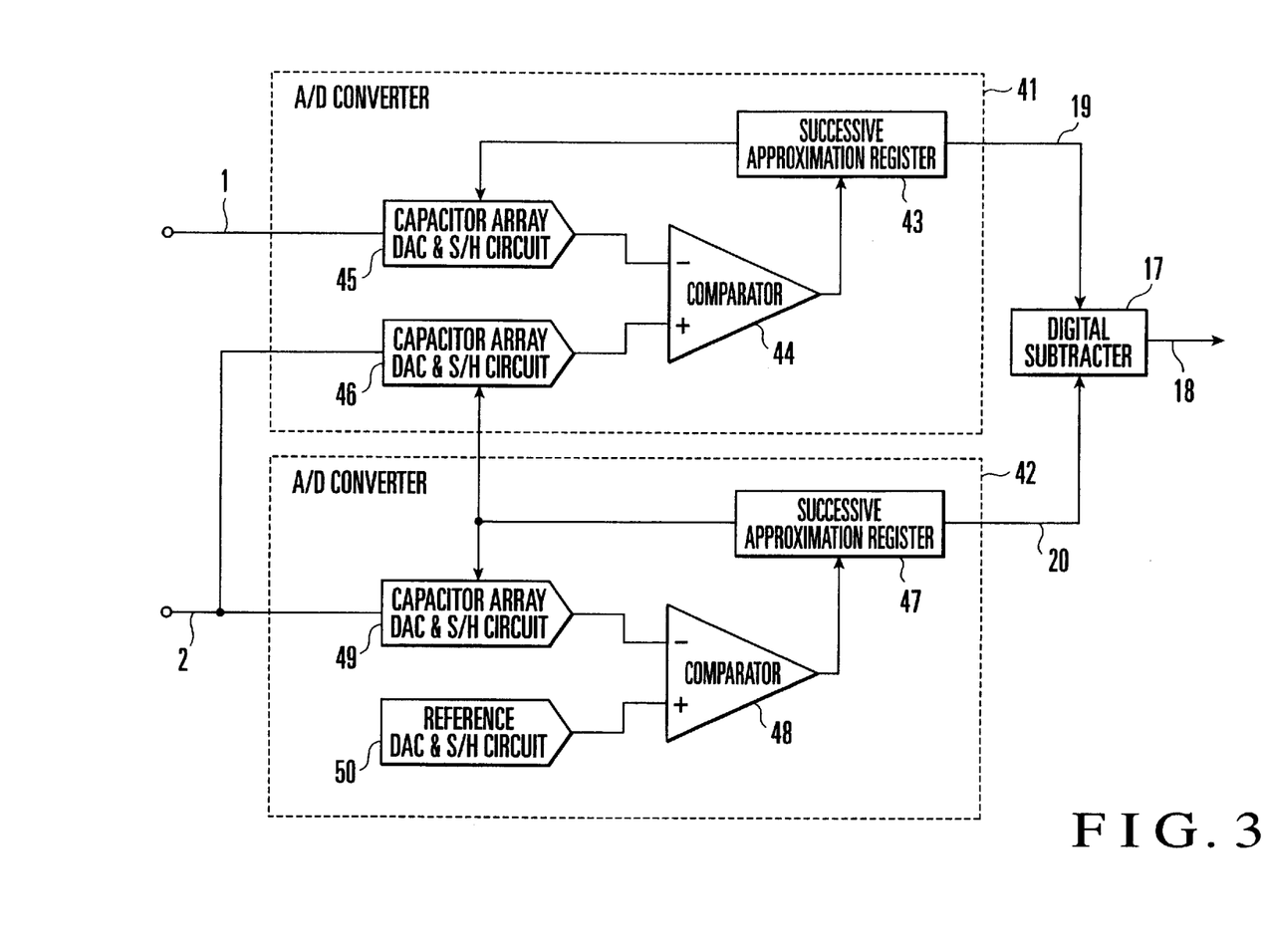
FIG. 3 is a block diagram showing a differential input A/D converter according to the second embodiment of the present invention.

FIG. 3 shows a successive approximation type differential input A/D converter according to the second embodiment of the present invention. The successive approximation type differential input A/D converter according to this embodiment is comprised of a first A/D converter 41, second A/D converter 42, and digital subtracter 17. In this embodiment, the A/D converters 15 and 16 of the differential input A/D converter are replaced with A/D converter 41 and 42.

The A/D converter 42 is comprised of a successive approximation register 47, comparator 48, capacitor array type D/A converter and sample/hold capacitor circuit (capacitor array DAC & S/H circuit) 49, and reference D/A converter & sample/hold capacitor circuit (reference DAC & S/H circuit) 50. The A/D converter 42 differs from the A/D converter 16 shown in FIG. 1 in that a second analog input signal 2 is input to the capacitor array DAC & S/H circuit 49, outputs from the capacitor array DAC & S/H circuit 49 and reference DAC & S/H circuit 50 are input to the comparator 48, and an output from the successive approximation register 47 is input to the A/D converter 41.

The A/D converter 41 is comprised of a successive approximation register 43, comparator 44, capacitor array DAC & S/H circuit 45, and capacitor array DAC & S/H circuit 46. The A/D converter 41 differs from the A/D converter 15 shown in FIG. 1 in that a first analog input signal 1 is input to the capacitor array DAC & S/H circuit 45, the second analog input signal 2 is input to the capacitor array DAC & S/H circuit 46, outputs from the capacitor array DAC & S/H circuits 45 and 46 are input to the comparator 44, and an output from the successive approximation register 47 is input to the capacitor array DAC & S/H circuit 46.

The operation of the differential input A/D converter according to this embodiment will be described next. In this embodiment, as in the first embodiment, four operations, i.e., sampling, the first successive approximation, the second successive approximation, and subtraction, are sequentially executed.

In sampling, the capacitor array DAC & S/H circuit 45 holds the voltage of the first analog input signal 1. The capacitor array DAC & S/H circuits 46 and 49 hold the voltage of the second analog input signal 2. The reference DAC & S/H circuit 50 holds a voltage equivalent to the second reference voltage 32 in the first embodiment.

In the first successive approximation, a target bit in the successive approximation register 47 is set to "1", and the digital value of the successive approximation register 47 at this time is D/A-converted by the capacitor array DAC & S/H circuit 49. The differential voltage between the analog signal obtained by D/A conversion and the voltage held by the capacitor array DAC & S/H circuit 49 is input to the inverting input terminal of the comparator 48. The voltage held by the reference DAC & S/H circuit 50 is input to the non-inverting input terminal of the second comparator 48. The comparator 48 compares the voltage at the inverting input terminal with the voltage at the non-inverting input terminal and stores the comparison result at the target bit in the successive approximation register 47.

As in the first embodiment, such first successive approximation is sequentially performed while the target bit is shifted from the most significant bit in the successive approximation register 47 to lower bits bit by bit. When the comparison results are stored at all the bits in the successive approximation register 47, the first successive approximation is completed. At this time, the digital value stored in the successive approximation register 47 is output as a second conversion result 20.

In the second successive approximation, the target bit in the successive approximation register 43 is set to "1", and the digital value of the successive approximation register 43 at this time is D/A-converted by the capacitor array DAC & S/H circuit 45. The digital value (second conversion result 20) output from the successive approximation register 47 of the A/D converter 42 is D/A-converted by the capacitor array DAC & S/H circuit 46.

The differential voltage between the analog signal obtained by D/A conversion by the capacitor array DAC & S/H circuit 45 and the voltage held by the capacitor array DAC & S/H circuit 45 is input to the inverting input terminal of the comparator 44. The differential voltage between the analog signal obtained by D/A conversion by the capacitor array DAC & S/H circuit 46 and the voltage held by the capacitor array DAC & S/H circuit 46 is input to the non-inverting input terminal of the comparator 44. The first comparator 44 compares with voltage at the inverting input terminal with the voltage at the non-inverting input terminal and stores the comparison result at the target bit in the successive approximation register 43.

As in the first embodiment, such second successive approximation is sequentially performed while the target bit is shifted from the most significant bit in the successive approximation register 43 to lower bits bit by bit. When the comparison results are stored at all the bits in the successive approximation register 43, the second successive approximation is completed. At this time, the digital value stored in the successive approximation register 43 is output as a first conversion result 19. The operation of the digital subtracter 17 is the same as that in the first embodiment.

In the first embodiment, the first successive approximation result is input as an output from the D/A converter 33 to the A/D converter 15 in the form of an analog value. In contrast to this, in this embodiment, the first successive approximation result is input as an output from the successive approximation register 47 to the A/D converter 41 it the form of a digital value, and the digital value is converted into an analog value by the capacitor array DAC & S/H circuit 46 of the A/D converter 41, thereby realizing the same operation as that in the first embodiment.

Figure 4:
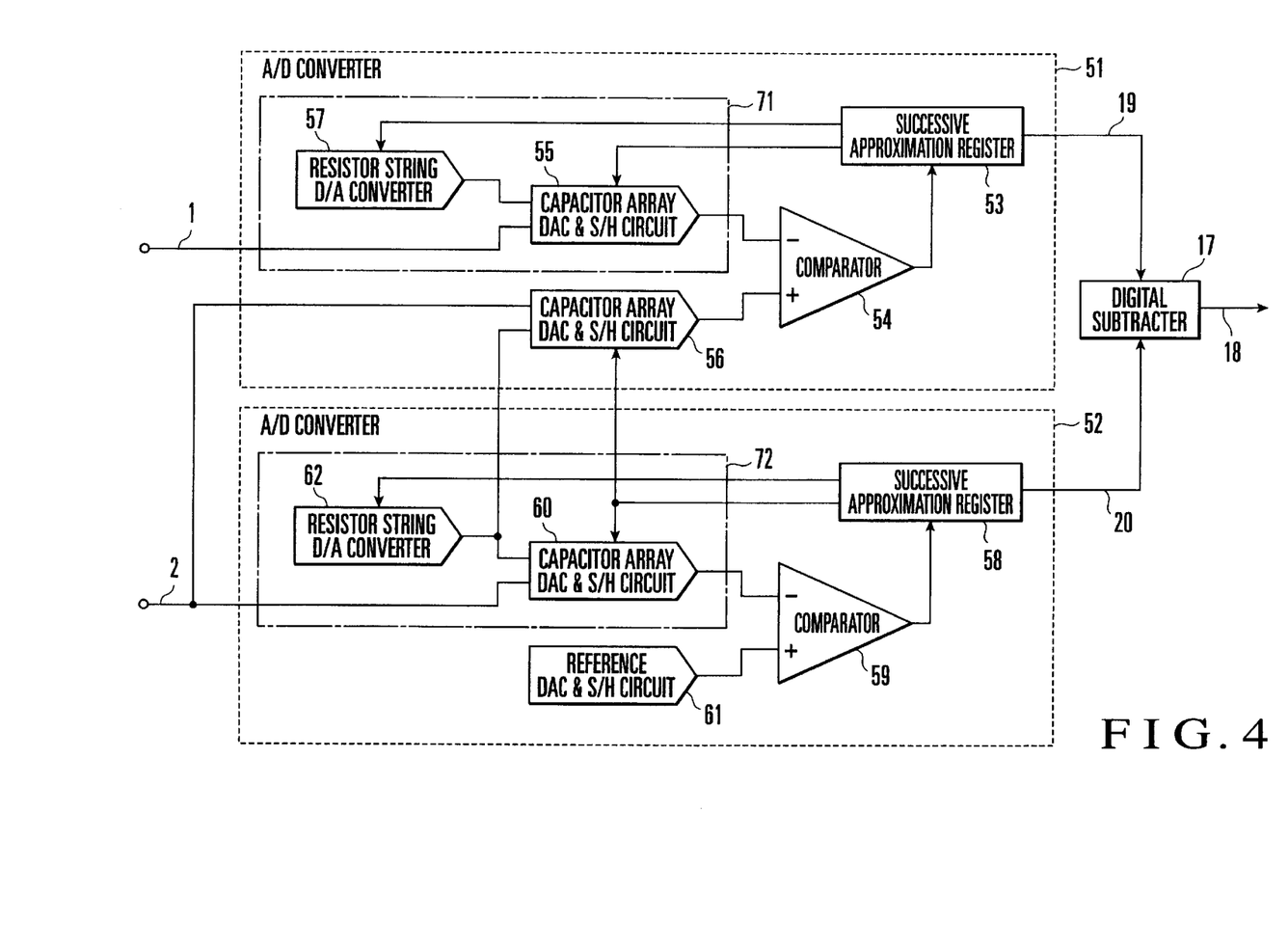
FIG. 4 is a block diagram showing a differential input A/D converter according to the third embodiment of the present invention.

FIG. 4 shows a differential input A/D converter according to the third embodiment of the present invention. The differential input A/D converter according to this embodiment is comprised of a first A/D converter 51, second A/D converter 52, and digital subtracter 17.

The first A/D converter 51 is comprised of a successive approximation register 53, comparator 54, capacitor array DAC & S/H circuit 55, capacitor array DAC & S/H circuit 56, and resistor string D/A converter 57. The second A/D converter 52 is comprised of a successive approximation register 58, comparator 59, capacitor array DAC & S/H circuit 60, reference DAC & S/H circuit 61, and resistor string D/A converter 62.

In this embodiment, a built-in D/A converter 71 of the first A/D converter 51 is comprised of the capacitor array DAC & S/H circuit 55 and resistor string D/A converter 57. A built-in D/A converter 72 of the second A/D converter 52 is comprised of the capacitor array DAC & S/H circuit 60 and resistor string D/A converter 62. The built-in D/A converters 71 and 72 correspond to the capacitor array DAC & S/H circuits 45 and 49 shown in FIG. 3.

As in the first embodiment, in this embodiment, four operations, i.e., sampling, the first successive approximation, the second successive approximation, and subtraction, are sequentially executed. In sampling, the capacitor array DAC & S/H circuit 55 holds the voltage of the first analog input signal 1. The capacitor array DAC & S/H circuits 56 and 60 hold the voltage of the second analog input signal 2. The capacitor array DAC & S/H circuit 60 holds a voltage equivalent to the second reference voltage 32 in the first embodiment.

In the first successive approximation, a target bit in the successive approximation register 58 is set to "1". The upper bit side of the digital value output from the successive approximation register 58 at this time is D/A-converted by the capacitor array DAC & S/H circuit 60, and the lower bit side is D/A-converted by the resistor string D/A converter 62.

The differential voltage between the analog signal obtained by D/A conversion by the capacitor array DAC & S/H circuit 60 and resistor string D/A converter 62 and the voltage held by the capacitor array DAC & S/H circuit 60 is input to the inverting input terminal of the comparator 59. The voltage held by the reference DAC & S/H circuit 61 is input to the non-inverting input terminal of the comparator 59. The comparator 59 compares the voltage at the inverting input terminal and the voltage at the non-inverting input terminal and stores the comparison result at the target bit in the successive approximation register 58.

As in the first embodiment, such first successive approximation is sequentially done while the target bit is shifted from the most significant bit in the successive approximation register 58 to lower bits bit by bit. When the comparison results are stored at all the bits in the successive approximation register 58, the first successive approximation is completed. At this time, the digital value stored in the successive approximation register 58 is output as a second conversion result 20.

In the second successive approximation, the target bit in the successive approximation register 53 is set to "1". The upper bit side of the digital value output from the successive approximation register 53 is D/A-converted by the capacitor array DAC & S/H circuit 55, and the lower bit side is D/A-converted by the resistor string D/A converter 57. In addition, the upper bit side of the digital value (second conversion result 20) output from the successive approximation register 58 is D/A-converted by the capacitor array DAC & S/H circuit 56, and the lower bit side is D/A-converted by the resistor string D/A converter 62.

The differential voltage between the analog signal obtained by D/A conversion by the capacitor array DAC & S/H circuit 55 and resistor string D/A converter 57 and the voltage held by the capacitor array DAC & S/H circuit 55 is input to the inverting input terminal of the comparator 54. In addition, the differential voltage between the analog signal obtained by D/A conversion by the capacitor array DAC & S/H circuit 56 and resistor string D/A converter 62 and the voltage held by the capacitor array DAC & S/H circuit 56 is input to the non-inverting input terminal of the comparator 54. The comparator 54 compares the voltage at the inverting input terminal with the voltage at the non-inverting input terminal and stores the comparison result at the target bit in the successive approximation register 53.

As in the first embodiment, such second successive approximation is sequentially done while the target bit is shifted from the most significant bit in the successive approximation register 53 to lower bits bit by bit. When the comparison results are stored at all the bits in the successive approximation register 53, the second successive approximation is completed. At this time, the digital value stored in the successive approximation register 53 is output as the first conversion result 19. The operation of the digital subtracter 17 is the same as that in the first embodiment.

In the first embodiment, the first successive approximation result is input as an output from the D/A converter 33 to the A/D converter 15 in the form of an analog value. In the second embodiment, the first successive approximation result is input as an output from the successive approximation register 47 to the first D/A converter 41 in the form of a digital value. The digital value is then converted into an analog value by the capacitor array DAC & S/H circuit 46 in the first D/A converter 41, thereby realizing the same operation as that of the first embodiment.

In contrast to this, in this embodiment, with regard to bits to be compared by the resistor string D/A converter, the first successive approximation result is input as an output signal from the resistor string D/A converter 62 to the first A/D converter 51 in the form of an analog value. With regards to bits to be compared by the capacitor array D/A converter, the first successive approximation result is input as an output value from the successive approximation register 58 to the first A/D converter 51 in the form of a digital value without conversion. The first successive approximation result is then converted into an analog value on the basis of the lower bit side D/A-converted by the resistor string D/A converter 62 and the upper bit side D/A-converted by the capacitor array DAC & S/H circuit 56, thereby realizing the same operation as that of the first embodiment.

In this embodiment, D/A conversion of the upper bit side is performed by the capacitor array D/A converter, and the lower bit side is D/A-converted by the resistor string D/A converter. In contrast to this, however, D/A conversion of the upper bit side is performed by the resistor string D/A converter, and the lower bit side is D/A-converted by the capacitor array D/A converter.

Figure 5:
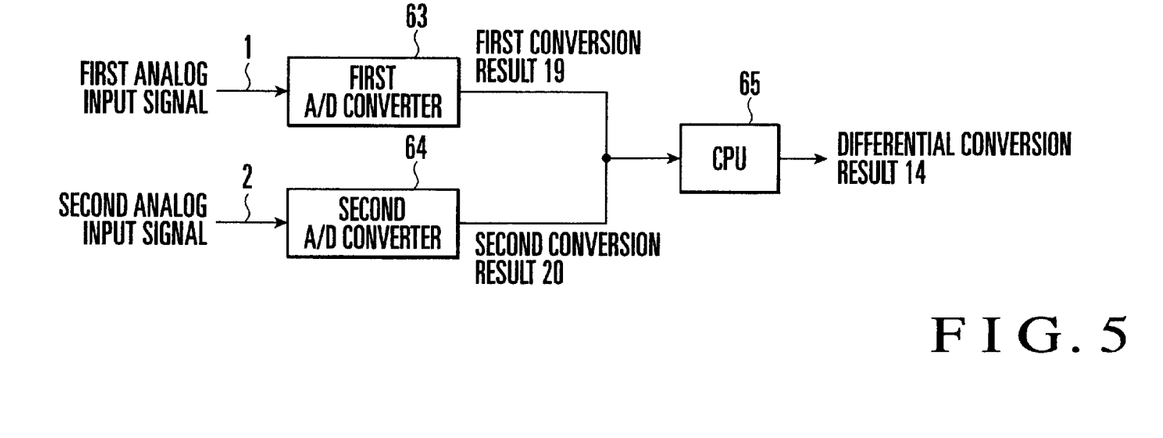
FIG. 5 is a block diagram showing a differential input A/D converter according to the fourth embodiment of the present invention.

FIG. 5 shows a differential input A/D converter according to the fourth embodiment of the present invention. The successive approximation type differential input A/D converter according to this embodiment is comprised of a first A/D converter 63, second A/D converter 64, and CPU (Central Processing Unit) 65.

The A/D converters 63 and 64 have the same arrangements as those of the A/D converters 15 and 16 described in the first embodiment, the A/D converters 41 and 42 described in the second embodiment, or the A/D converters 51 and 52 described in the third embodiment. In this embodiment, as in the first to third embodiments, the A/D converter 63 outputs a first conversion result 19, and the second A/D converter 64 outputs a second conversion result 20.

According to this embodiment, the differential input A/D converter and the CPU 65 formed from a microprocessor are integrated into one chip by an LSI (Large Scale Integrated-circuit) technique. The CPU 65 subtracts the second conversion result 20 from the first conversion result 19 and outputs a differential conversion result 18 as the subtraction result. With this operation, in this embodiment, the digital subtracter 17 can be omitted, and hence the chip area can be saved.

As has been described above, according to the present invention, since only the error produced in the first A/D converter appears in the differential conversion result, the quantization error in the differential input A/D converter can be made to fall within the range of −½ LSB to +½ LSB. As a result, there is no need to improve the precision of the A/D converter. In addition, since no analog subtracter is used, there is no need to improve the precision of the analog subtracter.

What is claimed is:

1. A differential input A/D converter which converts a potential difference between two analog input signals from an analog value to a digital value, comprising:
   first A/D conversion means for outputting a first conversion result obtained by A/D-converting a first analog input signal;
   second A/D conversion means for outputting a second conversion result obtained by A/D-converting a second analog input signal; and
   digital subtraction means for outputting a differential conversion result obtained by subtracting the second conversion result output from said second A/D conversion means from the first conversion result output from said first A/D conversion means,
   wherein the first A/D conversion means A/D-converts a difference between an analog value obtained from an output of said second A/D conversion means and the second analog input signal output from said second A/D conversion means and superimposes the A/D conversion result on the first conversion result.

2. A converter according to claim 1, wherein
   said second A/D conversion means comprises output means for outputting the second conversion result in the form of an analog value, and
   said first A/D conversion means A/D-converts a difference between the analog value output from said output means and the second analog input signal and superimposes the A/D conversion output on the first conversion result.

3. A converter according to claim 2, wherein
   said first A/D conversion means comprises
   a first D/A converter which outputs an analog value obtained by D/A-converting a first comparison signal,
   a first comparator which sequentially compares signals input to two input terminals, to one of which the analog value from said first D/A converter and the first analog input signal are selectively input via a sample/hold capacitor, and to the other of which an analog value obtained by D/A-converting a second comparison signal upon completion of successive approximation and the second analog input signal are selectively input via a sample/hold capacitor, and
   a first successive approximation register which sequentially stores a comparison result from said first comparator, outputs a digital value of the stored comparison result as the first comparison signal, and outputs a comparison result upon completion of successive approximation as a first conversion result, and
   said second A/D conversion means comprises
   a second D/A converter which outputs an analog value obtained by D/A-converting the second comparison signal,
   a second comparator which sequentially compares signals input to two input terminals, to one of which the analog value from said second D/A converter and the second analog input signal are selectively input via a sample/hold capacitor, and to the other of which a reference voltage is input via a sample/hold capacitor, and
   a second successive approximation register which sequentially stores a comparison result from said second comparator, outputs a digital value of the stored comparison result as the second comparison signal, and outputs a comparison result upon completion of successive approximation as a second conversion result.

4. A converter according to claim 3, wherein after successive approximation is executed by said second A/D converter, successive approximation is executed by said first A/D converter.

5. A converter according to claim 1, wherein
   said second A/D conversion means comprises output means for outputting the second conversion result in the form of a digital value, and
   said first A/D conversion means A/D-converts a difference between the second analog input signal and an analog value of the second conversion result obtained by D/A-converting a digital value output from said output means, and superimposes the A/D conversion output on the first conversion result.

6. A converter according to claim 5, wherein
   said first A/D conversion means comprises a first capacitor array type D/A converter and sample/hold capacitor circuit which outputs a difference between the first analog input signal and an analog value obtained by D/A-converting the first comparison signal, a second capacitor array type D/A converter and sample/hold capacitor circuit which outputs a difference between the second analog input signal and the second comparison signal upon completion of successive approximation by said second A/D conversion means, a first comparator which sequentially compares an output from said first capacitor array type D/A converter and sample/hold capacitor circuit with an output from said second capacitor array type D/A converter and sample/hold capacitor circuit, and a first successive approximation register which sequentially stores a comparison result from said first comparator, outputs a digital value of the stored comparison result as the first comparison signal, and outputs the comparison result upon completion of successive approximation as the first conversion result, and said second A/D conversion means comprises a third capacitor array type D/A converter and sample/hold capacitor circuit which outputs a difference between the second analog input signal and an analog value obtained by D/A-converting the second comparison signal, a reference D/A converter and sample/hold capacitor circuit which outputs a reference voltage;

a second comparator which sequentially compares an output from said third capacitor array type D/A converter and sample/hold capacitor circuit with an output from said reference D/A converter and sample/hold capacitor circuit, and a second successive approximation register which sequentially stores a comparison result from said second comparator, outputs a digital value of the stored comparison result as the second comparison signal, and outputs the comparison result upon completion of successive approximation as the second conversion result.

7. A converter according to claim 6, wherein after successive approximation is executed by said second A/D converter, successive approximation is executed by said first A/D converter.

8. A converter according to claim 1, wherein said second A/D conversion means comprises output means for outputting one of a lower bit side and upper bit side of the second conversion result in the form of a digital value, D/A-converts the remaining bits, and outputs a D/A conversion result in the form of an analog value, and said first A/D conversion means A/D-converts a difference between the second analog input signal and an analog value of the second conversion result obtained from the digital and analog values output from said output means and superimposes the A/D conversion output on the first conversion result.

9. A converter according to claim 8, wherein said first A/D conversion means comprises a first capacitor array type D/A converter and sample/hold capacitor circuit which obtains an analog value of the first comparison signal from an analog value obtained by D/A-converting one of a lower bit side and upper bit side of the first comparison signal and an analog value obtained by D/A-converting the remaining bits of the first comparison signal, and outputs a difference between the obtained analog value of the first comparison signal and the first analog input signal, a second capacitor array type D/A converter and sample/hold capacitor circuit which obtains an analog value of the second comparison signal from an analog value obtained by D/A-converting one of a lower bit side and upper bit side of the second comparison signal upon completion of successive approximation and an analog value obtained by D/A-converting the remaining bits of the second comparison signal upon completion of successive approximation, and outputs a difference between the obtained analog value of the second comparison signal and the second analog input signal, a first comparator which sequentially compares an output from said first capacitor array type D/A converter and sample/hold capacitor circuit with an output from said second capacitor array type D/A converter and sample/hold capacitor circuit, a resistor string D/A converter which inputs an analog value obtained by D/A-converting the remaining bits of the first comparison signal to said first capacitor array type D/A converter and sample/hold capacitor circuit, and a first successive approximation register which sequentially stores a comparison result from said first comparator, inputs one of a lower bit side and upper bit side of the first comparison signal represented by a digital value of the stored comparison result to said first capacitor array type D/A converter and sample/hold capacitor circuit, inputs the remaining bits of the first comparison signal to said resistor string D/A converter, and outputs a comparison result upon completion of successive approximation as the first conversion result, and said second A/D conversion means comprises a third capacitor array type D/A converter and sample/hold capacitor circuit which obtains an analog value of the second comparison signal from an analog value obtained by D/A-converting one of a lower bit side and upper bit side of the second comparison signal and an analog value obtained by D/A-converting the remaining bits of the second comparison signal, and outputs a difference between the obtained analog value of the second comparison signal and the second analog input signal, a reference D/A converter and sample/hold capacitor circuit which outputs a reference voltage, a second comparator which sequentially compares an output from said third capacitor array type D/A converter and sample/hold capacitor circuit and an output from said reference D/A converter and sample/hold capacitor circuit, a second resistor string D/A converter which inputs an analog value obtained by D/A-converting the remaining bits of the second comparison signal to said third capacitor array type D/A converter and sample/hold capacitor circuit, and a second successive approximation register which sequentially stores a comparison result from said second comparator, inputs one of a lower bit side and upper bit side of the second comparison signal represented by a digital value of the stored comparison result to said third capacitor array type D/A converter and sample/hold capacitor circuit, inputs the remaining bits of the second comparison signal to said second resistor string D/A converter, and outputs a comparison result upon completion of successive approximation as the second conversion result.

10. A converter according to claim 9, wherein after successive approximation is executed by said second A/D converter, successive approximation is executed by said first A/D converter.

11. A converter according to claim 1, wherein said digital subtraction means comprises a CPU (Central Processing Unit) which obtains a differential conversion result obtained by subtracting the second conversion result from the first conversion result.

12. A differential input A/D converter which converts a potential difference between two analog input signals from an analog value to a digital value, comprising:
   a first A/D converter which outputs a first conversion result obtained by A/D-converting a first analog input signal;
   a second A/D converter which outputs a second conversion result obtained by A/D-converting a second analog input signal; and
   a digital subtracter which outputs a differential conversion result obtained by subtracting the second conversion result from the first conversion result,
      wherein said second A/D converter comprises means for outputting the second conversion result in the form of an analog value, and
      said first A/D converter comprises means for superimposing, on the first conversion result, a result obtained by A/D-converting a difference between an analog value output from said second A/D converter and the second analog input signal.

13. A differential input A/D converter which converts a potential difference between two analog input signals from an analog value to a digital value, comprising:
   a first A/D converter which outputs a first conversion result obtained by A/D-converting a first analog input signal;
   a second A/D converter which outputs a second conversion result obtained by A/D-converting a second analog input signal; and
   a digital subtracter which outputs a differential conversion result obtained by subtracting the second conversion result from the first conversion result,
      wherein said second A/D converter comprises means for outputting the second conversion result in the form of a digital value, and
      said first A/D converter comprises means for obtaining an analog value of the second conversion result by D/A-converting the digital value output from said second A/D converter, and superimposing, on the first conversion result, a result obtained by A/D-converting a difference between the analog value of the second conversion result and the second analog input signal.

14. A differential input A/D converter which converts a potential difference between two analog input signals from an analog value to a digital value, comprising:
   a first A/D converter which outputs a first conversion result obtained by A/D-converting a first analog input signal;
   a second A/D converter which outputs a second conversion result obtained by A/D-converting a second analog input signal; and
   a digital subtracter which outputs a differential conversion result obtained by subtracting the second conversion result from the first conversion result,
      wherein said second A/D converter comprises means for outputting a lower bit side or upper bit side of the second conversion result in the form of a digital value, and D/A-converting the remaining bits, and outputs the D/A conversion result in the form of an analog value, and
      said first A/D converter comprises means for obtaining an analog value of the second conversion result from digital and analog values output from said second A/D converter, and superimposing, on the first conversion result, a result obtained by A/D-converting a difference between the analog value of the second conversion result and the second analog input signal.

* * * * *